United States Patent [19]

Wakashima et al.

[11] 3,939,488
[45] Feb. 17, 1976

[54] METHOD OF MANUFACTURING SEMICONDUCTOR DEVICE AND RESULTING PRODUCT

[75] Inventors: Yoshiaki Wakashima, Kawasaki; Hiroshi Suzuki, Hitachi, both of Japan

[73] Assignee: Hitachi, Ltd., Japan

[22] Filed: Feb. 28, 1974

[21] Appl. No.: 446,792

[30] Foreign Application Priority Data

Feb. 28, 1973  Japan.................. 48-23209

[52] U.S. Cl. .................. 357/72; 252/511; 252/300; 174/52 PE; 427/82
[51] Int. Cl.² ......................................... H01L 29/34
[58] Field of Search ....... 357/72; 117/212; 252/511, 252/300; 174/52 PE

[56] References Cited
UNITED STATES PATENTS

| | | | |
|---|---|---|---|
| 3,533,965 | 10/1970 | Ikeda et al. | 357/72 |
| 3,653,959 | 4/1972 | Kehr et al. | 357/72 |
| 3,684,592 | 8/1972 | Chang et al. | 357/72 |
| 3,696,263 | 10/1972 | Wacher | 357/72 |
| 3,700,497 | 10/1972 | Epifano et al. | 357/72 |
| 3,749,601 | 7/1973 | Tittle | 357/72 |
| 3,756,872 | 9/1973 | Goodman | 357/72 |

*Primary Examiner*—Andrew J. James
*Attorney, Agent, or Firm*—Craig & Antonelli

[57] ABSTRACT

In sealing at least a semiconductor element portion of a semiconductor device by the use of a resin, the semiconductor element is covered with a stabilizer or with a resin containing the stabilizer. The stabilizer is adapted to check the migration of a mobile substance such as hydrochloric acid and a mobile ion such as chlorine ion existent within the resin. Owing to the fixation of the ion, the electrical characteristics of the semiconductor device are prevented from being degraded, and constituent parts in the semiconductor device are prevented from being corroded.

24 Claims, 7 Drawing Figures

METHOD OF MANUFACTURING SEMICONDUCTOR DEVICE AND RESULTING PRODUCT

BACKGROUND OF THE INVENTION

1. Field of the Invention

The present invention relates to the manufacturing of a semiconductor device, and more particularly to a method of sealing the semiconductor device and the resulting sealed product.

2. Description of the Prior Art

As is well known, when a semiconductor device is used in a high temperature atmosphere or a high humidity atmosphere, it suffers such adverse effects that the electrical characteristics are degraded or that the electrode or connector is disconnected.

For example, when water adheres to an electrode 2 on a semiconductor substrate 1 as shown in FIG. 1, it is ionized on account of the temperature of the atmosphere in which the semiconductor device is used. Under the action of the ions, the bent protruding portion 3 of the electrode 2 or the connecting portion 5 between a bonding wire (connector) 4 and the electrode 2 is corroded.

The portion thus corroded is thinner than the other portions, and generates heat by the flow of a current. Finally, it is disconnected to render the device inferior.

When the ions accumulate on an exposed protective film ($SiO_2$) designated by reference numeral 6, they gradually invert the conductivity type in the surface portion of a collector region 7 from the side of a base region 8 and thus form a channel. As the ions accumulating on the protective film 6 increase, the channel grows. Eventually, it reaches the peripheral wall of the semiconductor substrate 1, and a leakage current flows to degrade the characteristics of the semiconductor device.

In order to prevent the adverse effects noted above, there has been adopted a method in which the semiconductor element is covered with a resin. With this method, however, the adverse effects cannot be perfectly eliminated.

In this respect, the inventors analyzed the states within the resins in resin-sealed type semiconductor devices, and have found the following facts:

Notwithstanding that an epoxy resin, a silicone resin or the like, which is generally employed, contains no chlorine (Cl) in its molecular structure, chlorine ions ($Cl^-$) are found in such resin coverings.

Since chlorine exists in any place in the form of a simple substance or compounds, chlorine will adhere to a mix into the resin in the process of producing each resin or in the process of assembling the semiconductor device.

The chlorine is ionized under the influence of, for example, an electric field. The chlorine ions migrate within the resin, accumulate in an electrode portion or a bonding wire, and corrode it. Further, the ions accumulate on a protective film, generate a leakage current by the foregoing phenomenon, and cause the degradation of the characteristics of the semiconductor device.

SUMMARY OF THE INVENTION

An object of the present invention is to provide a sealing method by which the degradation of the semiconductor characteristics of a semiconductor device can be prevented even where the semiconductor device is used in a high temperature and high humidity atmosphere.

Another object of the present invention is to provide a sealing method by which the corrosion of constituent components within a semiconductor device can be prevented even where the semiconductor device is used in a high temperature and high humidity atmosphere.

In order to accomplish such objects, the present invention provides that a stabilizer adapted to check the migration of a mobile substance and a mobile ion is contained in a resin for covering a semiconductor element.

BRIEF DESCRIPTION OF THE DRAWING

This invention will be further understood from the following detailed description and the accompanying drawing wherein.

PREFERRED EMBODIMENTS OF THE INVENTION

EMBODIMENT 1

Figure 1:
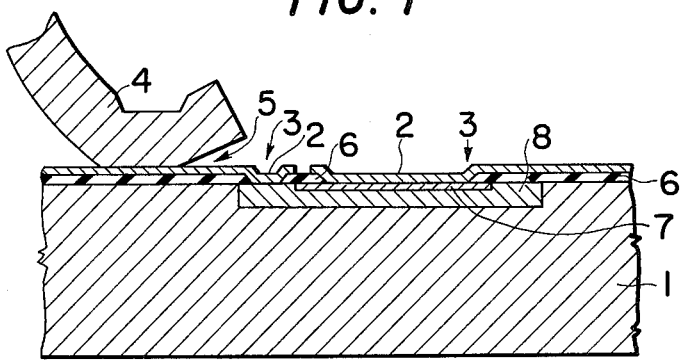
FIG. 1 is an enlarged view of a portion of a semiconductor device illustrating constituent parts subject to corrosion.
Figure 2:
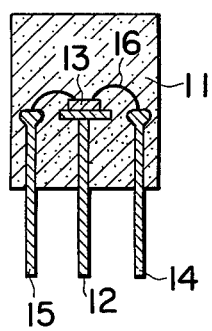
FIG. 2 is a structural view of a first embodiment of the present invention.

As shown in FIG. 2, a semiconductor element 13, i.e. a transistor, on a collector lead wire 12 and bonding wires 16 connecting the emitter region and the base region of the semiconductor element 13 with an emitter lead wire 14 and a base lead wire 15, respectively, are sealed by the use of a resin 11 in which 1% by weight of zinc mercaptide is added to an acid anhydride setting-type epoxy resin, i.e. ECN 1273 (a product of Ciba, Led., Switzerland). It will be understood that resins having epoxy radical and including acid anhydride are generally referred to as acid anhydride epoxy resins. The fore ends of the respective lead wires 12, 14 and 15 are caused to protrude from the resin 11.

By the addition of zinc mercaptide (stabilizer) into the resin, ions and substances migrating within the resin, such as $Cl^-$ and HCl, react with the stabilizer. Thus, the ions and substance stop migration and become chemically stable.

Figure 3A:
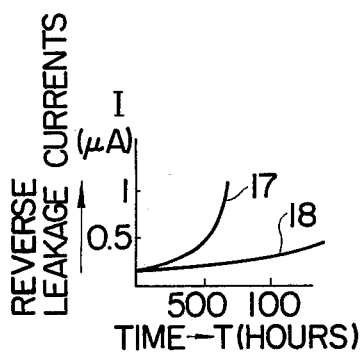
FIGS. 3a and 3b are graphs illustrating the leakage current value and the rate of corrosion of a sealed type semiconductor device manufactured according to the first embodiment, respectively.
Figure 3B:
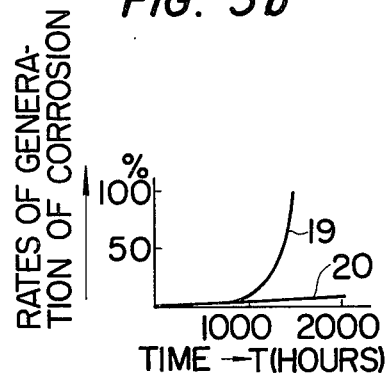

FIGS. 3a and 3b are graphs which illustrate the test results of the semiconductor device described above. FIG. 3a gives the results in the case where the transistors were operated at a rated voltage in an atmosphere at 125°C. and where the reverse leakage currents I (on the axis of ordinates in the graph, in $\mu A$) of the transistors were measured every 100 hours (on the axis of abscissas, in hours). A curve 17 indicates the measured results for a prior-art resin-sealed type semiconductor device, employing a similar epoxy resin containing no stabilizer while a curve 18 represents the measured values for the semiconductor device of the embodiment of this invention.

As apparent from the graph, the time in which the semiconductor device becomes unusable due to the degradation of the electric characteristic is prolonged with a leap, i.e. with a substantial increase. Except in the case of too severe environments, the semiconductor device can accordingly be used for a very long period without any substantial degradation of the characteristics.

On the other hand, FIG. 3b illustrates the results in the case where the rates of generation (on the axis of ordinates in the graph, in %) of the corrosion of electrodes were tested for the semiconductor device of the foregoing structure and the prior-art semiconductor device at a temperature of 80°C. and a humidity of 90%. The axis of abscissas in the figure represents the time T. A curve 19 indicates the measured values for the prior-art device, while a curve 20 denotes those for the embodiment of this invention.

As apparent from this graph, the rate of generation of the electrode corrosion is lower in the semiconductor device of the present invention than in the prior-art semiconductor device.

In this manner, owing to the addition of 1 part of zinc mercaptide to 100 parts of the acid anhydride setting-type epoxy resin, the ions migrating within the resin, for example, the chlorine ions react with the stabilizer and become chemically stable, so that they do not corrode the electrode portion or the connecting part between the bonding wire and the electrode portion. Furthermore, the existence of the ions on the protective film is avoided, so that the inversion of the semiconductor region is prevented and the generation of a leakage current is prevented.

Figure 4A:
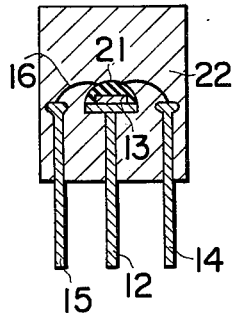
FIGS. 4a to 4c are structural views each showing a further embodiment applying the techniques of first embodiment shown in FIG. 2.
Figure 4B:
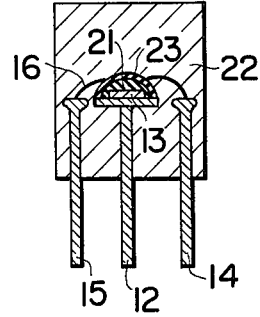
Figure 4C:
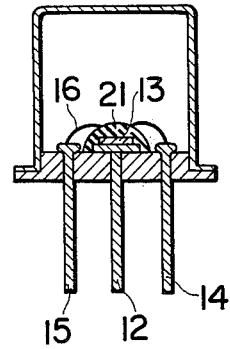

FIGS. 4a to 4c show different sealing structures. The sealing structure in FIG. 4a is a double structure in which after the semiconductor element 13 is sealed by a covering layer 21 made of only the stabilizer (zinc mercaptide) or of the stabilizer and the previously-mentioned resin, the whole device is sealed by an epoxy resin 22. This structure is suitable where the stabilizer is expansive.

The structure in FIG. 4b takes account of the case where any adverse effect arises from the contact of the stabilizer (zinc mercaptide) with the semiconductor element 13. This embodiment is a triple structure in which the semiconductor element 13 is enveloped in a stable protective resin (e.g., epoxy resin) layer 23, the device is subsequently covered with the covering layer 21 made of only the stabilizer (zinc mercaptide) or of the stabilizer and the acid anhydride setting-type epoxy resin, and the resultant device is further sealed by an epoxy resin 22.

The structure in FIG. 4c is applied to a can-sealed type semiconductor device. The semiconductor element 13 is sealed by the covering layer 21 made of only zinc mercaptide or of the zinc mercaptide and the acid anhydride setting-type epoxy resin.

As regards the structures in FIGS. 4a to 4c, the principal effects are the same as in the structure in FIG. 2, and are not again explained here.

EMBODIMENT 2

Using an acid anhydride setting-type epoxy resin, i.e. the one used in Embodiment 1 with 1% of zinc salicylate added thereto, a semiconductor element is molded as in Embodiment 1.

The results are substantially the same as in Embodiment 1 and hence, further explanation is omitted.

EMBODIMENT 3

Using an acid anhydride setting-type epoxy resin, i.e. the one used in Embodiment 1 with 1% of an organic lead compound, i.e. lead phthalate, added thereto, a semiconductor element is molded as in Embodiment 1.

The results are substantially the same as in Embodiment 1, and further explanation is omitted.

Although, in the foregoing embodiments, the acid anhydride setting-type epoxy resin is employed as the principal component resin, there may also be used different epoxy resins, silicone resins, phenol resins, polyimide resins, polyamide resins, etc., which resins are conventionally used as protective coverings for semiconductors.

The stabilizers in the embodiments are not restrictive, and others may be used, for example, the carbonate, salt of organic or inorganic acid, e.g. hydrochloric, nitric and acetic acid, alcoholate, phenolate, mercaptide or organic metal compound, e.g. phthalate of calcium (Ca), magnesium (Mg), strontium (Sr), cadmium (Cd), zinc (Zn), tin (Sn) or lead (Pb).

As stated above, according to the method of the present invention for manufacturing a semiconductor device, mobile charge carriers within a resin are fixed by a stabilizer, so that the degradation of semiconductor characteristics, such as increase of the leakage current, fluctuation of the withstand voltage, fluctuation of the current again ($h_{fe}$) and increase of the noise, can be prevented.

Moreover, according to the method of the present invention, corrosive mobile substances within a resin, such as hydrochloric acid and organic acid, e.g. phthalic acid and oleic acid, are fixed by the stabilizer and become chemically stable, so that the corrosion of constituent parts within the semiconductor device can be prevented.

Furthermore, according to the method of the present invention, semiconductor devices of infrequent troubles can be manufactured.

It will be appreciated from the foregoing examples of the invention that various amounts of stabilizer may be admixed with the protective resin. In general, the amount of stabilizer uniformly dispersed throughout the resin ranges from 0.1 to 10% by weight of the weight of the resin.

Also, the thickness of a protective resin covering layer containing a stabilizer or of the layer of stabilizer alone may range from $1\mu$ to 1 millimeter.

While the novel principles of the invention have been described, it will be understood that various omissions, modifications and changes in these principles may be made by one skilled in the art without departing from the spirit and scope of the invention.

What is claimed is:

1. A method for sealing a semiconductor device comprising covering a semiconductor element with a protective covering layer containing a metal-containing stabilizer which prevents the migration of mobile substances and mobile ions within the protective covering layer, said metal-containing stabilizer comprising a salt of an organic acid, an alcoholate, a phenolate or mercaptide, the metal component of said metal-containing stabilizer being selected from the group consisting of Ca, Mg, Sr, Cd, Zn, Sn and Pb.

2. The method of claim 1, wherein said stabilizer is selected from the group consisting of zinc mercaptide, zinc salicylate and lead phthalate.

3. The method of claim 2, wherein said layer is synthetic resin containing from 0.1 to 10% by weight of said stabilizer.

4. The method of claim 3, wherein the protective layer has a thickness ranging from $1\mu$ to 1 mm.

5. The method of claim 2, wherein the protective layer has a thickness ranging from $1\mu$ to 1 mm.

6. The method of claim 1, wherein said stabilizer is zinc mercaptide.

7. The method of claim 1, wherein said stabilizer is zinc salicylate.

8. The method of claim 1, wherein said stabilizer is lead phthalate.

9. The method of claim 1, wherein said layer is synthetic resin containing from 0.1 to 10% by weight of said stabilizer.

10. The method of claim 1, wherein the protective layer has a thickness ranging from $1\mu$ to 1 mm.

11. A sealed semiconductor device comprising a semiconductor element having a protective covering layer covering a portion thereof, said protective covering layer containing a metal-containing stabilizer which prevents the migration of mobile substances and mobile ions within the protective covering layer, said metal-containing stabilizer comprising a salt of an organic acid, an alcoholate, a phenolate or mercaptide, the metal component of said metal-containing stabilizer being selected from the group consisting of Ca, Mg, Sr, Cd, Zn, Sn and Pb.

12. The device of claim 2, wherein said stabilizer is selected from the group consisting of zinc mercaptide, zinc salicylate and lead phthalate.

13. The device of claim 12, wherein said layer is synthetic resin containing from 0.1 to 10% by weight of said stabilizer.

14. The device of claim 11, wherein said stabilizer is zinc mercaptide.

15. The device of claim 11, wherein said stabilizer is zinc salicylate.

16. The device of claim 11, wherein said stabilizer is lead phthalate.

17. The device of claim 11, wherein said layer is synthetic resin containing from 0.1 to 10% by weight of said stabilizer.

18. The device of claim 11, wherein the protective layer has a thickness ranging from $1\mu$ to 1 mm.

19. The device of claim 13, wherein the protective layer has a thickness ranging from $1\mu$ to 1 mm.

20. The device of claim 12, wherein the protective layer has a thickness ranging from $1\mu$ to 1 mm.

21. The device of claim 12, wherein said protective covering layer includes a member selected from the group consisting of epoxy resin, silicon resin, phenol resin, polyimide resin and polyamide resin.

22. The device of claim 11, wherein said protective covering layer includes a member selected from the group consisting of epoxy resin, silicon resin, phenol resin, polyimide resin and polyamide resin.

23. The method of claim 2, wherein said protective covering layer includes a member selected from the group consisting of epoxy resin, silicon resin, phenol resin, polyimide resin and polyamide resin.

24. The method of claim 1, wherein said protective covering layer includes a member selected from the group consisting of epoxy resin, silicon resin, phenol resin, polyimide resin and polyamide resin.

* * * * *